United States Patent
Danjo

(10) Patent No.: US 8,760,338 B2
(45) Date of Patent: Jun. 24, 2014

(54) COMPAPATOR AND ANALOG-TO-DIGITAL CONVERTOR

(71) Applicant: Fujitsu Limited, Kawasaki (JP)

(72) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/671,381

(22) Filed: Nov. 7, 2012

(65) Prior Publication Data

US 2013/0176156 A1    Jul. 11, 2013

(30) Foreign Application Priority Data

Jan. 10, 2012  (JP) .................................. 2012-002138

(51) Int. Cl.
    *H03M 1/34*    (2006.01)
(52) U.S. Cl.
    USPC .......................................... 341/158; 341/155
(58) Field of Classification Search
    USPC ......... 341/158, 160, 155, 124, 166, 137, 154, 341/172, 161, 133; 327/64, 77, 124
    See application file for complete search history.

(56) References Cited

U.S. PATENT DOCUMENTS

| | | | |
|---|---|---|---|
| 6,157,222 A | 12/2000 | Yaklin | |
| 6,366,113 B1 | 4/2002 | Song | |
| 2003/0132779 A1 | 7/2003 | Yoo et al. | |
| 2006/0290554 A1 | 12/2006 | Ishii | |
| 2007/0279275 A1 | 12/2007 | Ishii | |
| 2010/0238057 A1* | 9/2010 | Wood | 341/124 |
| 2010/0243768 A1 | 9/2010 | Yano et al. | |
| 2011/0215959 A1* | 9/2011 | Matsuzawa et al. | 341/160 |

FOREIGN PATENT DOCUMENTS

| | | | |
|---|---|---|---|
| JP | 10-065542 A | 3/1998 |
| JP | 2000-307391 A | 11/2000 |
| JP | 2001-223754 A | 8/2001 |
| JP | 2003-273938 A | 9/2003 |
| JP | 2006-270726 A | 10/2006 |
| JP | 2010-109937 A | 5/2010 |
| JP | 2010-223553 A | 10/2010 |

OTHER PUBLICATIONS

Daniel Schinkel, et al., "A Double-Tail Latch-Type Voltage Sense Amplifier with 18ps Setup+Hold Time", IEEE, ISSCC 2007; Dig. of Tech. Paper, pp. 314-315, Feb. 2007.

* cited by examiner

*Primary Examiner* — Joseph Lauture
(74) *Attorney, Agent, or Firm* — Arent Fox LLP

(57) ABSTRACT

A comparator includes: a differential amplifier circuit to operate based on a clock signal and output a first intermediate output and a second intermediate output corresponding to a first input signal and a second input signal respectively; and a differential latch circuit to operate based on the clock signal and vary a state based on the first intermediate output and the second intermediate output, the differential latch circuit having a controllable sensitivity with respect to a state variation of the first intermediate output and the second intermediate output.

12 Claims, 17 Drawing Sheets

COMPAPATOR AND ANALOG-TO-DIGITAL CONVERTOR

CROSS-REFERENCE TO RELATED APPLICATIONS

This application is based upon and claims the benefit of priority of the prior Japanese Patent Application No. 2012-2138, filed on Jan. 10, 2012, the entire contents of which are incorporated herein by reference.

FIELD

The embodiments discussed herein are related to a comparator and an Analog-to-Digital (A/D) converter.

BACKGROUND

A comparator compares voltage levels of two input signals and outputs a comparison result. A flash-type A/D converter includes several comparators. A 4-bit flash-type A/D converter includes at least 15 comparators. To convert a high frequency analog signal into a digital signal, a flash-type A/D converter that includes comparators performing high speed operation is desired.

The relevant technique is disclosed in Japanese Laid-open Patent Publication No. 2010-109937, Japanese Laid-open Patent Publication No. 2010-223553, Japanese Laid-open Patent Publication No. 10-065542, Japanese Laid-open Patent Publication No. 2000-307391, Japanese Laid-open Patent Publication No. 2006-270726, Japanese Laid-open Patent Publication No. 2001-223754, Japanese Laid-open Patent Publication No. 2003-273938, or D. Schinkel, E. Mensink, E. Klumperink, E. Van Tuiji, B. Nauta: "A Double-Tail Latch-Type Voltage Sense Amplifier with 18 ps Setup+Hold Time", IEEE, ISSCC 2007, Dig. Of Tech. Paper, pp. 314-315, February 2007.

SUMMARY

According to one aspect of the embodiments, a comparator includes: a differential amplifier circuit to operate based on a clock signal and output a first intermediate output and a second intermediate output corresponding to a first input signal and a second input signal respectively; and a differential latch circuit to operate based on the dock signal and vary a state based on the first intermediate output and the second intermediate output, the differential latch circuit having a controllable sensitivity with respect to a state variation of the first intermediate output and the second intermediate output.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE EMBODIMENTS

Although a dynamic latch comparator operates at high speed, a two-stage dynamic latch comparator may be used to reduce power consumption.

An offset due to fabrication variation of a transistor included in the comparator, asymmetry of a layout, or the like may affect the operation of the comparator. Therefore, correction may be performed in such a way that the offset becomes zero. When the offset is adjusted, a threshold value (an input voltage difference with which an output is inverted) of the comparator may be set to an arbitrary value when a reference voltage is not generated.

For example, an adjustment circuit, which includes a charge pump, a switch, and a capacity, is provided from an external unit, with respect to the gate of the transistor corresponding to an input differential pair of the two-stage dynamic latch comparator, and the threshold of the input differential pair may be adjusted. In the two-stage dynamic latch comparator, by coupling a variable capacity to a signal node from a front stage to a latter stage, the load of signal change is adjusted, whereby the threshold value of the comparator may be adjusted.

When the adjustment circuit is coupled, a consumption power based on a steady current may increase as the circuit area increases. Since a capacity is added as a load to a current path of a signal, the power may increase and the operation speed may decrease.

Figure 1:
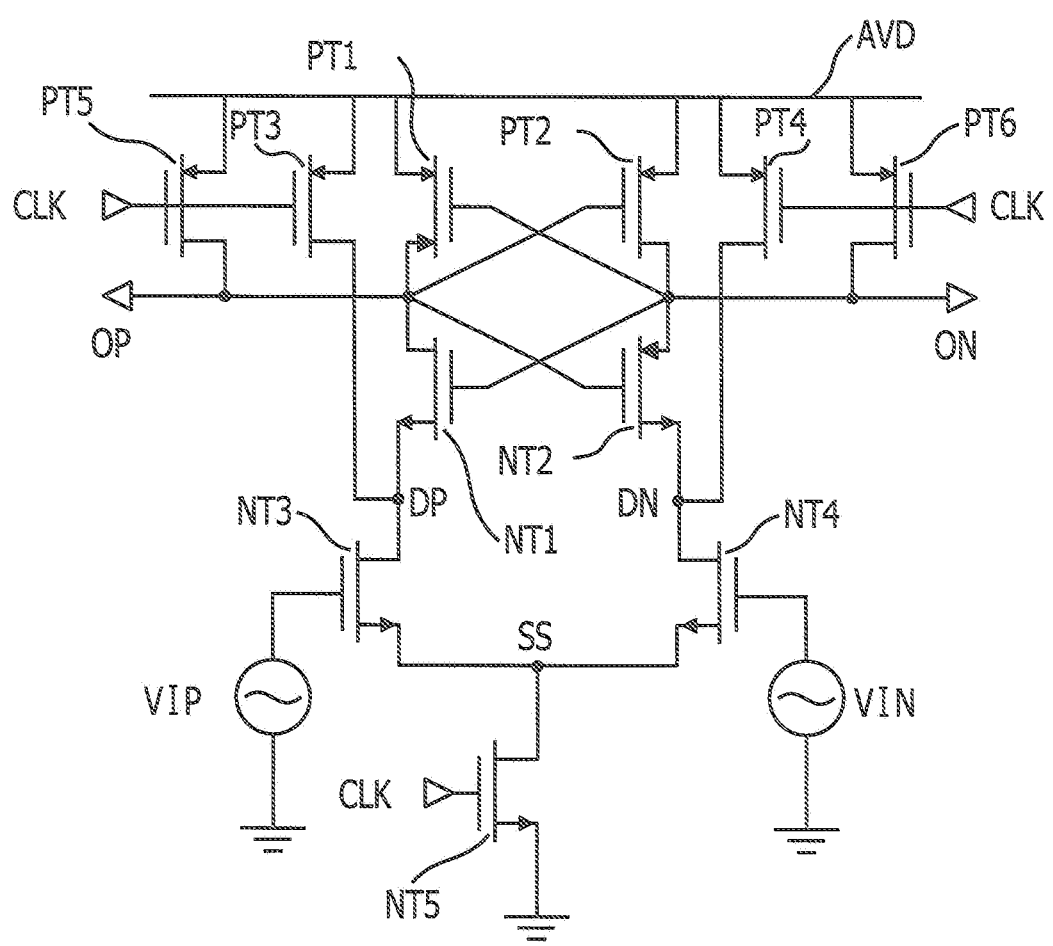
FIG. 1 illustrates an exemplary dynamic latch comparator.

FIG. 1 illustrates an exemplary dynamic latch comparator. In the comparator, a first line in which a PMOS transistor PT 1 and an NMOS transistor NT 1 are coupled in series and a second line in which a PMOS transistor PT 2 and an NMOS transistor NT 2 are coupled in series are provided in parallel. Gates of the PT 1 and the NT 1 are coupled to coupling nodes of the PT 2 and the NT 1 respectively to receive an output signal (a comparison result) ON from the coupling nodes. The gates of the PT 1 and the NT 2 are coupled to the coupling nodes of the PT 1 and the NT 1 respectively to receive an output signal (a comparison result) OP from the coupling nodes. For example, the PT 1, the PT 2, the NT 1, and the NT 2 may form a latch circuit. The output signals OP and ON may be reversed-phase signals.

A PMOS transistor PT 3 is coupled to the first line in parallel, and a clock signal CLK is applied to a gate of the PMOS transistor PT 3. A PMOS transistor PT 4 is coupled to the second line in parallel, and the CLK is applied to the gate of the PMOS transistor PT 4. A PMOS transistor PT 5 is coupled to the PT 1 in parallel, for example, between an analog high potential power source AVD and an output terminal of the OP, and the CLK is applied to the gate of the PMOS transistor PT 5. A PMOS transistor PT 6 is coupled to the PT 2 in parallel, for example, between the AVD and the output terminal of the ON, and the CLK is applied to the gate of the PMOS transistor PT 6.

A source of the NT 1 is coupled to a node DP. A source of the NT 2 is coupled to a node DN. An NMOS transistor NT 3 is coupled between the DO and a node SS. An NMOS transistor NT 4 is coupled between the DN and the SS, An NMOS transistor NT 5 is coupled between the SS and an analog low potential power source GND. Differential input signals VIP and VIN are input into the gate of the NT 3 and the NT 4. The CLK is applied to the gate of the NT 5.

For example, if CLK=Low level (L), the PT 3, the PT 4, the PT 5, and the PT 6 are turned on (conducted), and the DP, the DN, the OP, and the ON are charged to a high level (H). Since the NT 5 is turned off (interrupted), the steady current may not flow.

For example, if CLK=H (high level), the PT 3, the PT 4, the PT 5, and the PT 6 are turned off, and the NT 5 is turned on. In this state, the NT 3 and the NT 4 are conducted according to the voltage of the VIP and the VIN, and the flowing current amount varies according to the voltage of the VIP and the VIN. When the current flows in the NT 3 and the NT 4, the DP and the DN are discharged. However, the discharging speed varies according to the current amount flowing in the NT 3 and the NT 4. Based on a variation of the discharging speed, the latch circuit performs latch operation, so that the OP becomes a high level or a low level and the ON is at the opposite level.

The comparator illustrated in FIG. 1 is a four-stage comparator in which four MOS transistors are coupled in series between the AVD and the GND. Thus, an application voltage of each stage of the MOS transistor decreases. Thus, high-speed of the comparator may be difficult.

Figure 2:
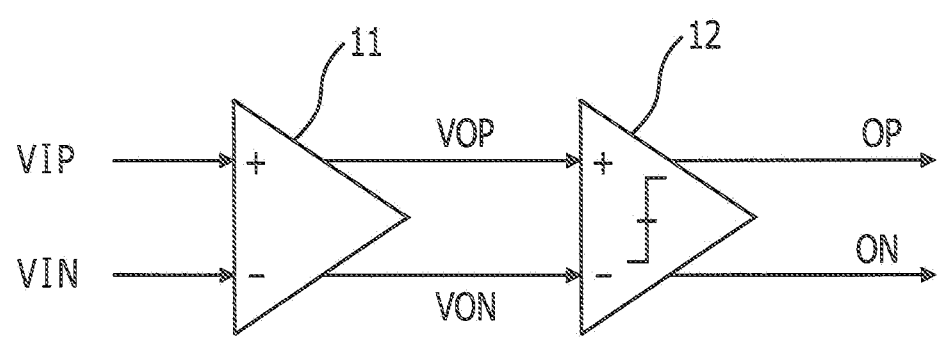
FIG. 2 illustrates an exemplary comparator.

FIG. 2 illustrates an exemplary comparator. In FIG. 2, to achieve the high-speed, a preamplifier 11 is provided in the front stage of a comparator 12. The preamplifier 11 amplifies the input signals VIP and VIN and then outputs amplified outputs VOP and VON. The comparator 12 determines the size of the amplified outputs VOP and VON and then outputs comparison results OP and ON. Since the voltage difference of the signals that are input into the comparator 12 illustrated in FIG. 2 increases, the speed may increase. Since the steady current flows in the regular preamplifier 11, the consumption power may not be reduced.

In the two-stage dynamic latch comparator, comparing and amplifying processing is performed in the front stage and latch is performed in the latter stage.

Figure 3:
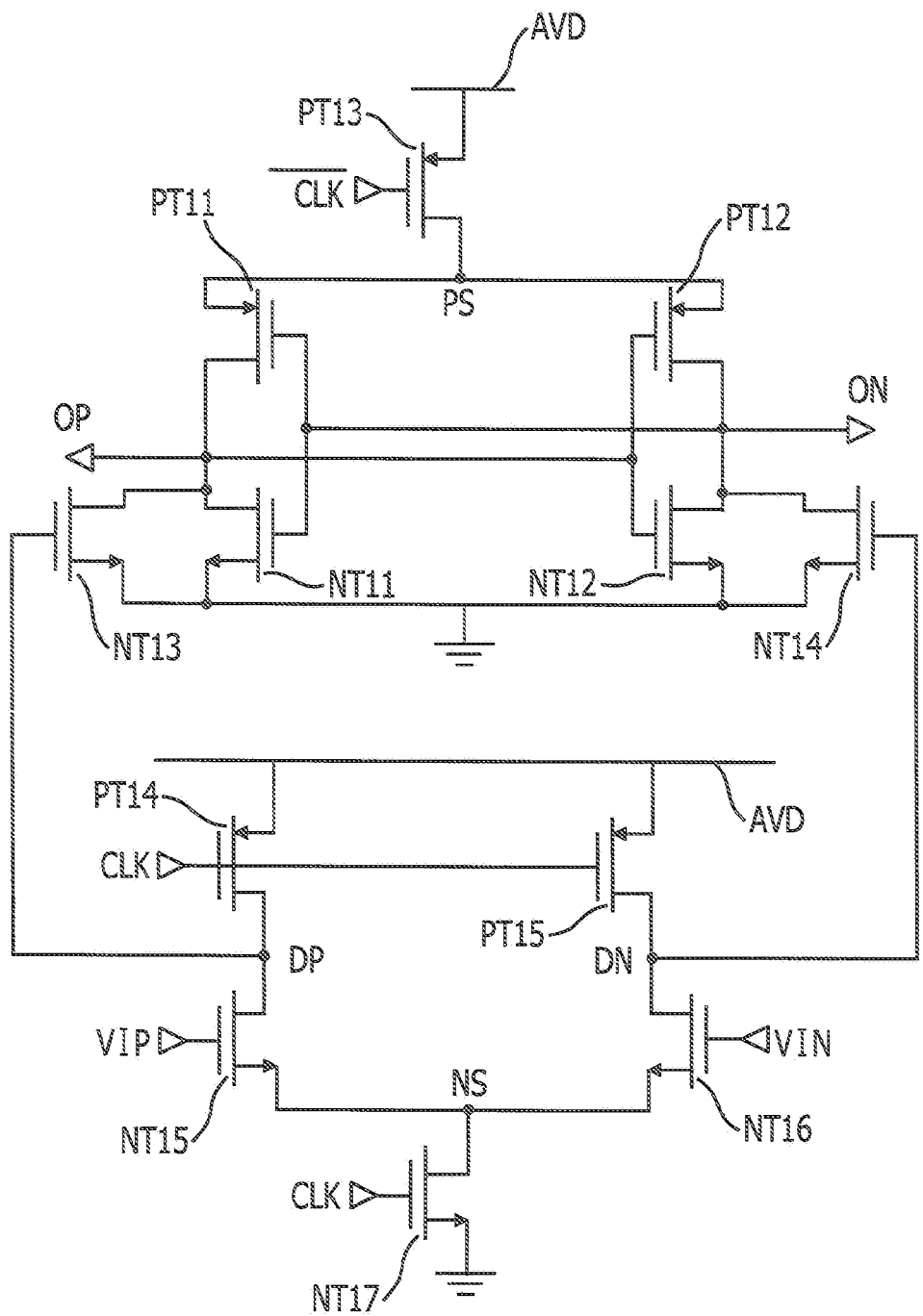
FIG. 3 illustrates an exemplary two-stage dynamic latch comparator.

FIG. 3 illustrates an exemplary two-stage dynamic latch comparator. The two-stage dynamic comparator includes a front stage part and a latter stage part. The front stage part includes a PMOS transistor PT 14 and an NMOS transistor NT 15, which are coupled in series, and a PMOS transistor PT 15 and an NMOS transistor NT 16, which are coupled in series, provided in parallel between the AVD and a node NS. The CLK is applied to the gate of the PT 14 and the PT 15. The input signal VIP is input into the gate of the NT 15. The input signal VIN is input into the gate of the NT 16. An NMOS transistor NT 17 is coupled between the NS and the GND, and the CLK is applied to the gate of the NT 17. The signals of the coupling node DP of the PT 14 and the NT 15 and of the coupling node DN of the PT 15 and the NT 16 may correspond to an output signal toward the latter stage.

In the later stage, as illustrated in FIG. 1, PMOS transistors PT 11 and PT 12 and NMOS transistors NT 11 and NT 12 may form a latch circuit. An output sign& OP is output from the coupling node of the PT 11 and the NT 11. An output signal ON is output from the coupling node of the PT 12 and the NT 12. The source of the PT 11 and the PT 12 is coupled to the node PS. The source of the NT 11 and the NT 12 is coupled to the GND. The PMOS transistor PT 13 is coupled between the AVD and the PS, and /CLK is applied to the gate of the PMOS transistor PT 13. The /CLK indicates a signal attached with an overline to CLK. The NMOS transistor NT 13 is provided in parallel to the NT 11. The NMOS transistor NT 14 is provided in parallel to the NT 12. The gate of the NT 13 is coupled to the DR The gate of the NT 14 is coupled to the DN.

Figure 4:
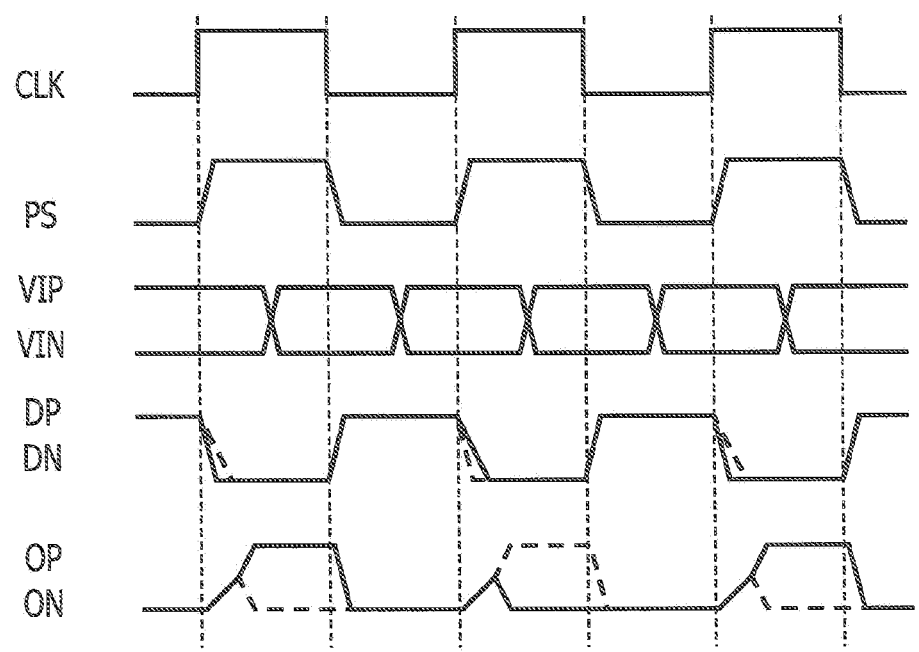
FIG. 4 illustrates an exemplary operation of a two-stage dynamic latch comparator.

FIG. 4 illustrates an exemplary operation of a two-stage dynamic latch comparator. The operation illustrated in FIG. 4 may be the operation of the two-stage dynamic latch comparator illustrated in FIG. 3.

For example, if CLK=L (low level), the circuit illustrated in FIG. 3 is in a reset period. The DP and the DN are set to a high level, and the PS, the OP, and the ON are set to a low level.

If CLK=H (high level), the front stage of the circuit illustrated in FIG. 3 starts comparing the VIP to the VIN. The PT 14 and the PT 15 are turned off, and the NT 17 is turned on. The current corresponding to the VIP and the VIN flows in the NT 15 and the NT 16. Since the PT 14 and the PT 15 are turned off, the current of the DP and the DN is extracted according to the VIP and the VIN. The DP and the ON decrease toward L (low level). The current flowing in the NT 15 and the NT 16 may vary according to the VIP and the VIN, for example, a difference between the current flowing in the NT 15 and the current flowing in the NT 15 occurs, and the decreasing speed of the OP may be different from the decreasing speed of the DN. For example, the decreasing speed of the DP in a case where VIP>VIN is high, and the decreasing speed of the DN in a case where VIP<VIN is high. In FIG. 4, the solid line indicates the faster side of the decrease, and the dashed line indicates the slower side of the decrease.

In the latter stage with /CLK=L (low level), the PT 13 is turned on, and the current starts flowing. Charging of the OP and the ON is started. The NT 13 and the NT 14 are turned on because the DP and the DN are applied to the gate thereof. Since the current is extracted from the node of the OP and the ON, the charging of the OP and the ON varies according to the extent of the decrease of the DP and the DN. If VIP>VIN, the DP decreases faster than the DN. Thus, the NT 13 is turned off earner. The current leaking from the NT 13 decreases, so that the OP becomes the high level earlier than the ON. When the OP becomes the high level, the charging of the ON stops in the latch circuit. Indicated by a solid line illustrated in FIG. 4, the ON becomes low level. If VIP<VIN, the opposite operation may occur.

The two-stage dynamic latch comparator illustrated in FIG. 3 is a three-stage comparator. Thus, compared to the comparator illustrated in FIG. 1, the two-stage dynamic latch comparator may operate at high-speed. Since the current may not flow if CLK=L (low level) after the determination of CLK=H (high level), the two-stage dynamic latch comparator may have low electric power.

Figure 5:
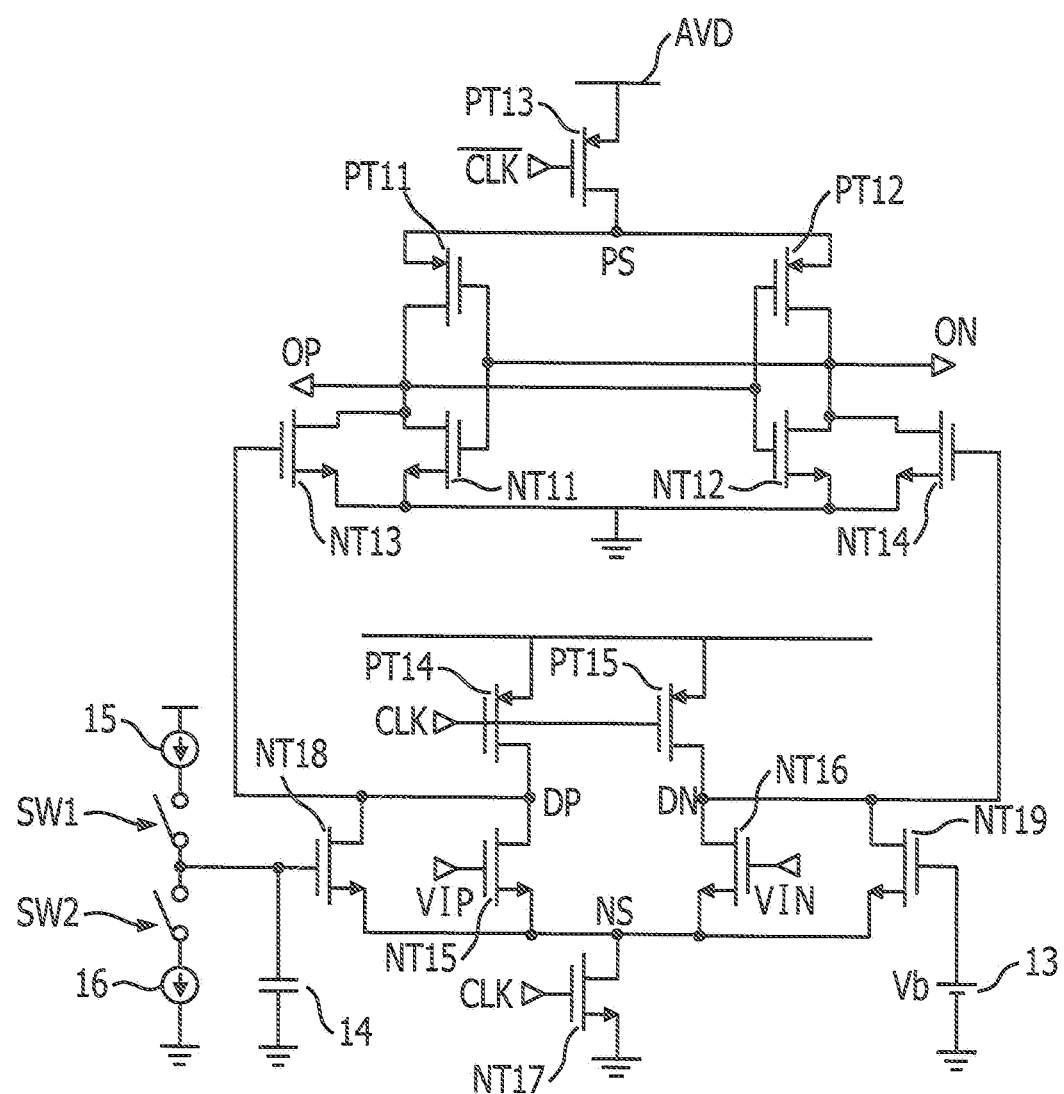
FIG. 5 illustrates an exemplary two-stage dynamic latch comparator.

FIG. 5 illustrates an exemplary two-stage dynamic latch comparator. In FIG. 5, the offset of the two-stage dynamic latch comparator illustrated in FIG. 3 is adjusted. As illustrated in FIG. 5, the NMOS transistors NT 18 and NT 19 are provided in parallel to the NT 15 and the NT 16 corresponding to the input differential pair to which the input signals VIP and VIN are input. An adjustment voltage Vb is applied to the gate of the NT 19. A charge pump 15, switches SW 1 and SW 2, and a charge pump 16 are coupled to each other in series. The coupling node of the SW 1 and the SW 2 is grounded through a capacity 14 and coupled to the gate of the NT 18. When a timing at which the switches SW 1 and SW 2 are conducted is adjusted, a charging time of the capacity 14 is adjusted. Thus, the gate voltage of the NT 18 varies. Therefore, based on the input of a prescribed input voltage into the VIP and the VIN, the gate voltage of the NT 18 varies, and the comparator is set to a state in which a comparison result is switched. For example, when the comparator is set to a state in which the comparison result varies according to the prescribed input voltage, a threshold value is set.

In the circuit illustrated in FIG. 5, to adjust the offset, the charge pumps 15 and 16, the switches SW 1 and SW 2, the capacity 14, and the like are coupled from an external. As a result, as the circuit area increases, the power consumption may increase based on the steady current.

Figure 6:
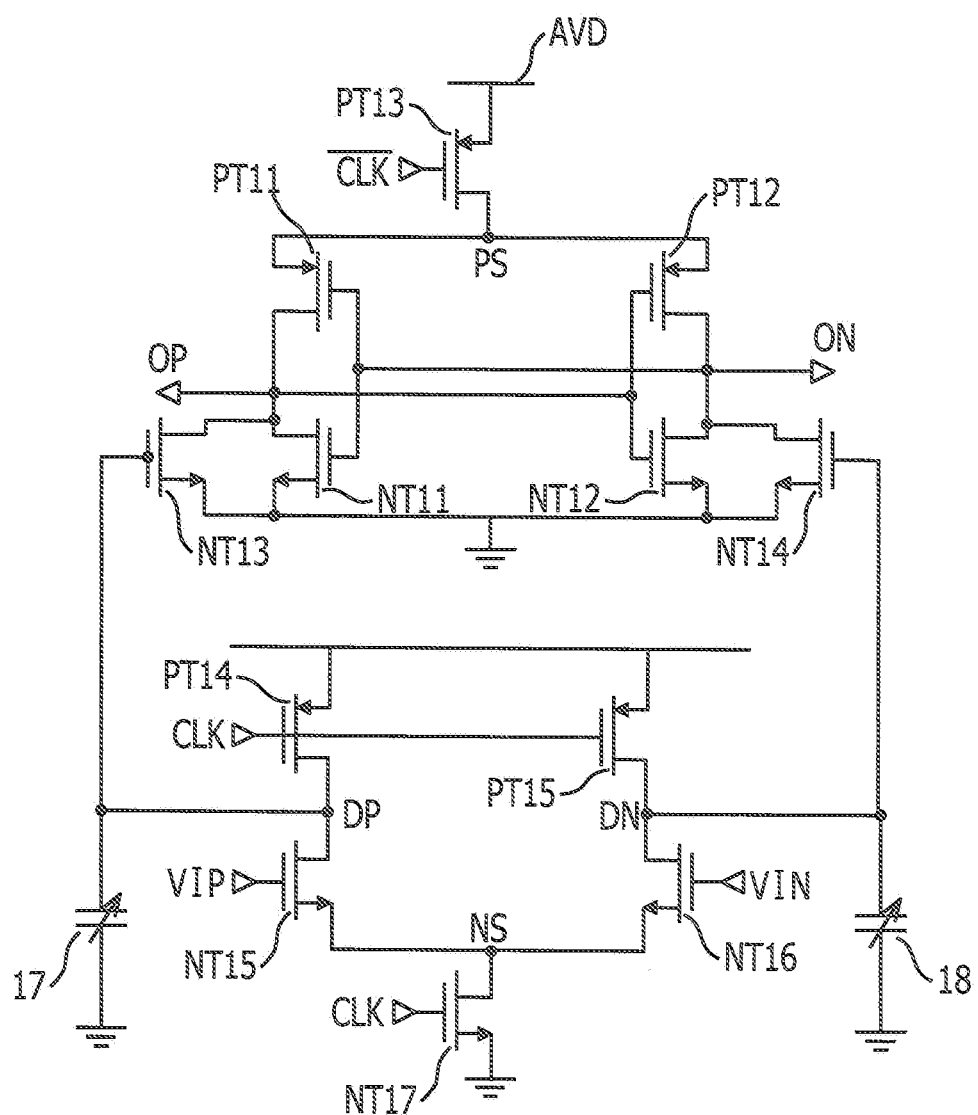
FIG. 6 illustrates an exemplary the two-stage dynamic latch comparator.
Figure 15:
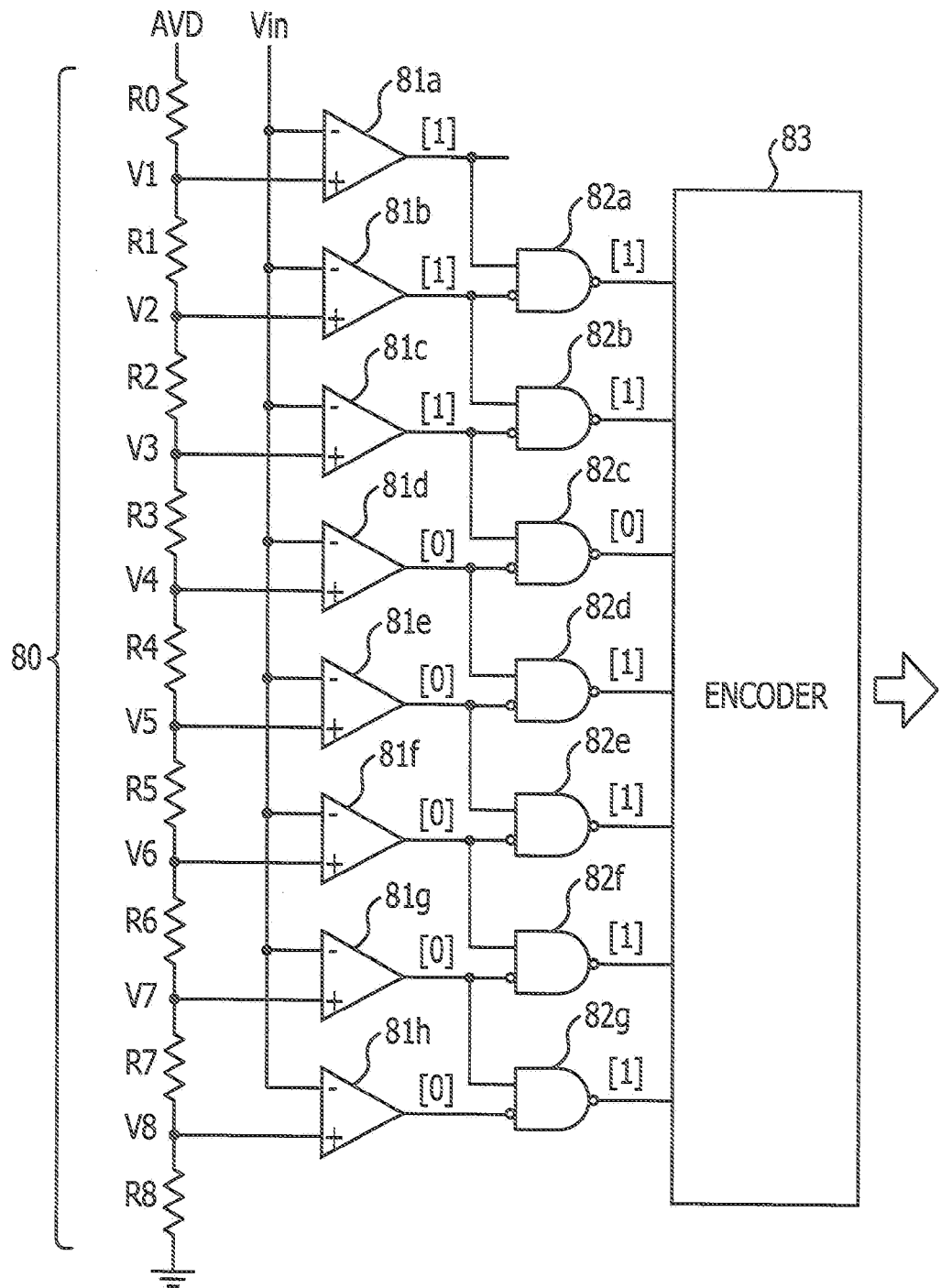
FIG. 15 illustrates an exemplary A/D converter.

FIG. 6 illustrates an exemplary two-stage dynamic latch comparator. In FIG. 15, the offset of the two-stage dynamic latch comparator illustrated in FIG. 3 is adjusted. In the circuit illustrated in FIG. 6, a variable capacity 17 is coupled between the node DP and the GND, and a variable capacity 18 is coupled between the node DN and the GND. When the capacity of the variable capacities 17 and 18 is changed, the load that changes the DP and the DN varies. Thus, the threshold value of the comparator varies.

In the circuit illustrated in FIG. 6, since the capacity is added as a load to a current path, the power increases and the operation speed may decrease.

Figure 7:
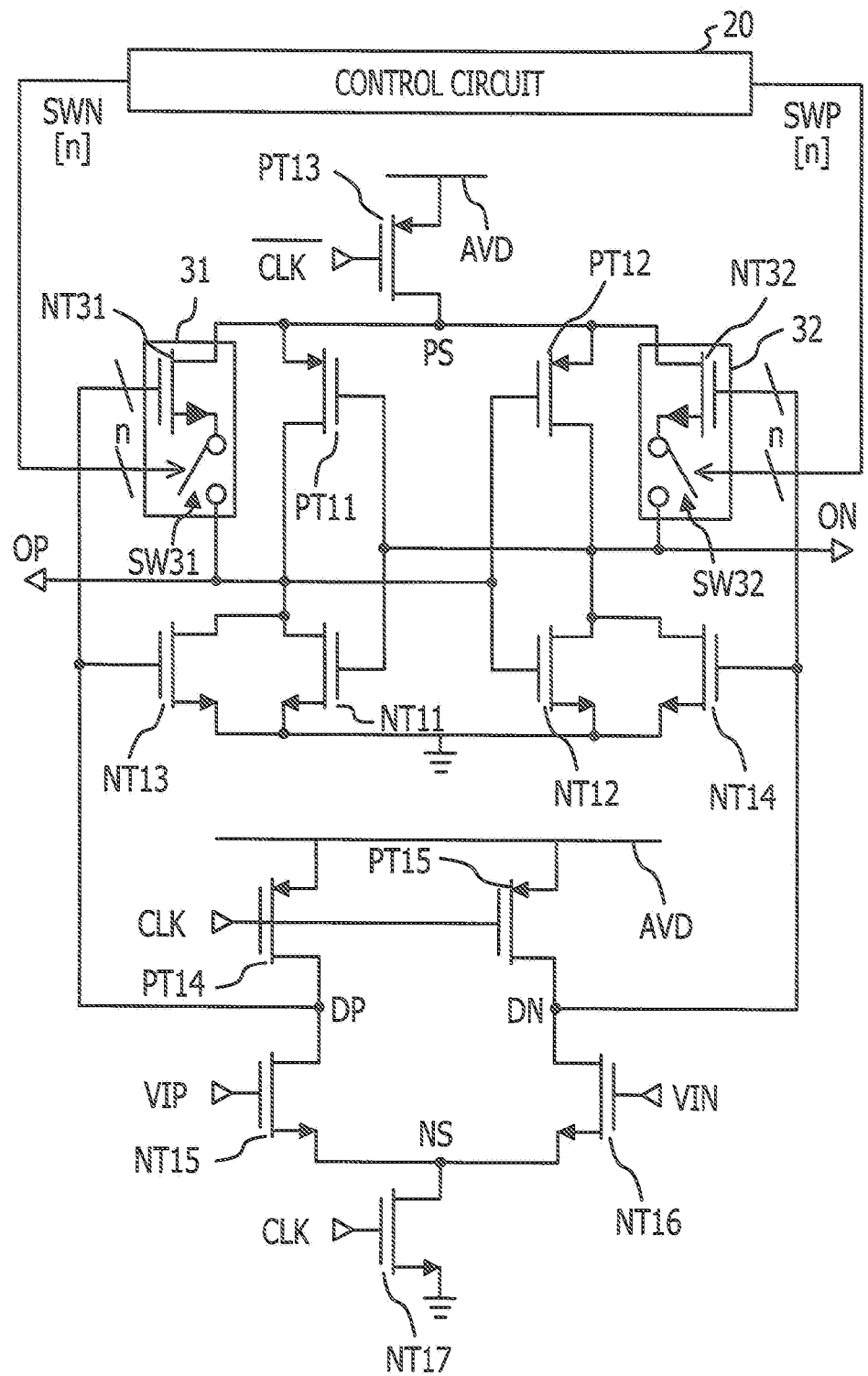
FIG. 7 illustrates an exemplary comparator.

FIG. 7 illustrates an exemplary comparator.

The comparator illustrated in FIG. 7 may be a two-stage dynamic latch comparator. The comparator includes a front stage part, a latter stage part, and a control circuit 20. The front stage part includes the PMOS transistor PT 14 and the NMOS transistor NT 15, which are coupled in series, and the PMOS transistor PT 15 and the NMOS transistor NT 16, which are coupled in series. The line of the PT 14 and the NT 15 and the line of the PT 15 and the NT 16 are provided in parallel between AVD and the node NS. The NT 15 and the NT 16 may correspond to the input differential pair. The CLK is applied to the gate of the PT 14 and the PT 15. The input signal VIP is input into the gate of the NT 15, and the input signal VIN is input into the gate of the NT 16. The NMOS transistor NT 17 is coupled between the NS and the GND, and the CLK is applied to the gate of the NMOS transistor NT 17. The signals of the coupling node DP of the PT 14 and the NT 15 and of the coupling node DN of the PT 15 and the NT 16 may correspond to the output signal toward the latter stage.

In the latter stage, a first line in which the PMOS transistor PT 11 and the NMOS transistor NT 11 are coupled in series is provided in parallel to a second line in which the PMOS transistor PT 12 and the NMOS transistor NT 12 are coupled in series. The gate of the PT 11 and the NT 11 is coupled to the coupling node of the PT 12 and the NT 12. The output signal (comparison result) ON may be obtained from the coupling node. The gate of the PT 12 and the NT 12 is coupled to the coupling node of the PT 11 and the NT 11. The output signal (comparison result) OP may be obtained from the coupling node. For example, the PT 11, the PT 12, the NT 11, and the NT 12 may form a latch circuit. The output signals OP and ON are reversed-phase signals.

The source of the PT 11 and the PT 12 is coupled to a node PS. The source of the NT 11 and the NT 12 is coupled to the GND. The PMOS transistor PT 13 is coupled between the AVD and the PS, and the /CLK is applied to the gate of the PMOS transistor PT 13. The NMOS transistor NT 13 is provided in parallel to the NT 11, and the NMOS transistor NT 14 is provided in parallel to the NT 12. The gate of the NT 13 is coupled to the DR The gate of the NT 14 is coupled to the DN.

The comparator illustrated in FIG. 7 includes a correction circuit 31 provided in parallel to the PT 11 and a correction circuit 32 provided in parallel to the PT 12. The correction circuit 31 may include a plurality of lines in which the NMOS transistor 31 and a switch SW 31 are coupled in series. However, FIG. 7 illustrates a single line. The switch SW 31 of each line is controlled by a control signal SWN [n] from the control circuit 20. For example, based on the control signal SWN [n], the control circuit 20 may adjust the number of the NMOS transistors 31 coupled to the PT 11 in parallel.

The correction circuit 32 includes a plurality of lines in which the NMOS transistor 32 and a switch SW 32 are coupled in series. Based on the control signal SWP [n], the control circuit 20 may adjust the number of NMOS transistors 31 coupled to the PT 12 in parallel.

Figure 8:
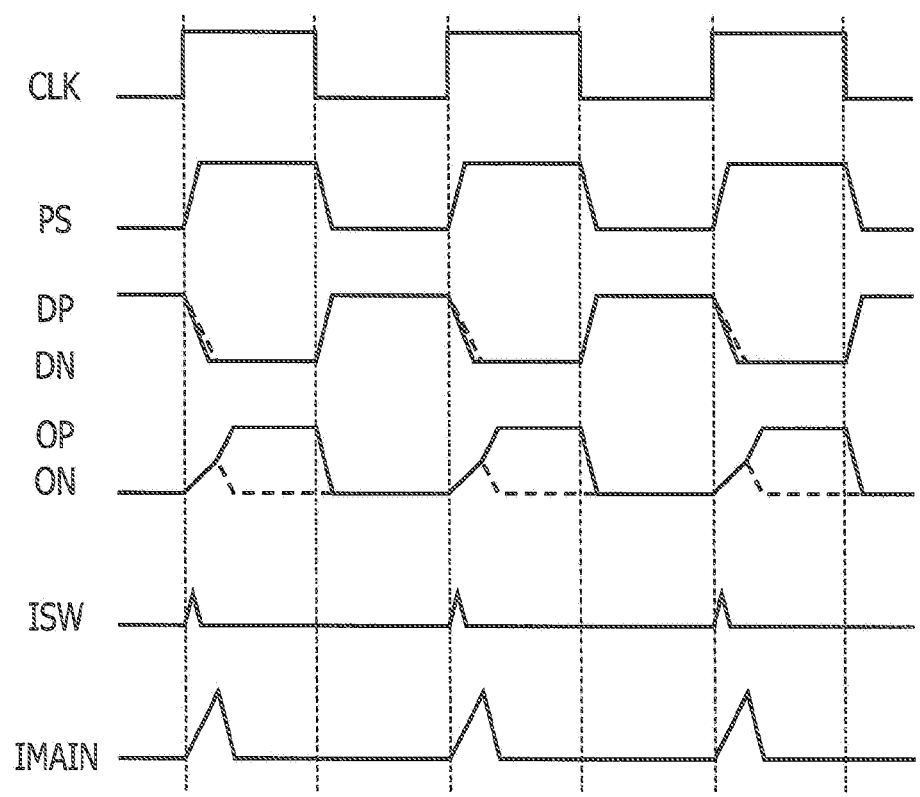
FIG. 8 illustrates an exemplary operation of a comparator.

FIG. 8 illustrates an exemplary operation of a comparator. FIG. 8 may be d time chart of the comparator illustrated in FIG. 7.

In the reset period of the comparator in a case of CLK=L (low level), the DP and the DN are set to a high level. The PS, the OP, and the ON are set to a low level.

If CLK=H (high level), the front stage of the comparator starts comparing the VIP to the VIN. The PT 14 and the PT 15 are turned off, and the NT 17 is turned on. The current according to the VIP and the VIN starts flowing in the NT 15 and the NT 16. Since the PT 14 and the PT 15 are turned off, the current of the DP and the DN is extracted according to the VIP and the VIN. Thus, the DP and the DN decrease toward L (low level). According to the VIP and the VIN, the current flowing in the NT 15 and the NT 16 varies, for example, a difference between the current flowing in the NT 15 and the current flowing in the NT 15 occurs, so that a decreasing speed of the DP and the DN may vary. For example, the decreasing speed of the DP with VIP>VIN is high, and the decreasing speed of the DN with VIP<VIN is high. In FIG. 4, the solid line indicates the faster side of the decrease, and the dashed line indicates the slower side of the decrease.

In the latter stage with /CLK=L (low level), the PT 13 is turned on, and the current starts flowing. Charging of the OP and the ON is started. The NT 13 and the NT 14 are turned on as the voltage of the DP and the DN is applied to the gate thereof. The current is extracted (discharged) from the node of the OP and the ON. The NT 31 of the correction circuit 31 and the NT 32 of the correction circuit 32 are turned on as the voltage of the DP and the DN is applied to the gate thereof. The NT 31 and the NT 32 in the line in which the SW 31 is turned on flow the current (discharges) into the node of the OP and the ON. Accordingly, the charge of the OP and the ON may vary according to the extent of the decrease of the DP and the DN. For example, if the drive performance of the PT 13 is assumed to be high enough, the voltage decrease of the OP is determined by the drive performance obtained by subtracting the drive performance of the NT 13 from the sum of the total drive performance of the NT 31 coupled (the SW 31 is turned on) to the correction circuit 31 and the drive performance of the PT 11. The voltage decrease of the ON is determined by the drive performance obtained by subtracting the drive performance of the NT 14 from the sum of the total drive performance of the NT 32 coupled (the SW 32 is turned on) to the correction circuit 32 and the drive performance of the PT 12. Therefore, when the number of the SWs 31 to be turned on in the correction circuit 31 and the number of the SWs 32 to be turned on in the correction circuit 31 are adjusted, the drive power by which the DP and the DN drive the differential latch circuit varies, and the extent of the decrease of the voltage of the OP and the ON may be adjusted. For example, the sensitivity of the state variation of the differential latch circuit by the DP and the DN may be adjusted by the correction circuits 31 and 32.

When the SW 31 of the correction circuit 31 and the SW 32 of the correction circuit 32 are turned off, the output is reversed at a time of VIP−VIN=0 if the comparator is defined not to have the offset. The threshold value may be changed into VIP−VIN=a prescribed value>0.

When the input signal as VIP>VIN is input, the DP decreases to the low level earlier. The current flowing from the OP decreases, and more electric charge remains in the node of the OP than in the node of the ON. By turning on the SW 32 in the correction circuit 32 that is controlled by the SWP [n], the current is caused to flow at the node of the ON at the determination (CLK=H) through the NT 32 and the electric charge is given to the node, thereby compensating and adjusting the differential of the electric charge. If the number of SWs 32 to be turned on increases, VIP-VIN=a prescribed value increases. Thus, the number of SWs 32 to be turned on is set to be a desired prescribed value.

If VIP<VIN, the SW 31 of the correction circuit 31 is turned on, the number of SWs 31 to be turned on is adjusted, and VIN-VIP is set to a prescribed value. VIP-VIN may correspond to the offset. If VIP-VIN=a prescribed value=0 is set, the offset may become zero. If a prescribed value≠0 is set, the threshold value may be set to a desired prescribed value. The processing for setting the threshold value to the desired prescribed value is applicable to the processing in a case where the offset is set to zero.

The correction circuits 31 and 32 flow the current simply at a time of determination and may not flow the current in other periods of time. For example, if the voltage of the node DP or the node DN exceeds a threshold value Vth of the transistor and if the voltage of the node PS is not 0, the current may flow. ISW illustrated in FIG. 8 indicates a timing at which the NT 31 and the NT 32 of the correction circuits 31 and 32 are turned on. IMAIN illustrated in FIG. 8 indicates the current flowing in the node of the outputs OP and ON. The consumption power of the current flowing in the correction circuits 31 and 32 and the comparator may be small because the period of CLK=H (high level) is short.

For example, depending on whether one of the NT 31 and the NT 32 is coupled, the threshold value variation of 5 mV may occur. For example, to set VIP−VIN=10 mV, two transistors may be turned on. If the threshold variation amount for one of the NT 31 or the NT 32 is previously obtained, the control circuit 20 may start the circuit operation after setting the SW 31 or the SW 32 to ON or OFF according to the data indicating the threshold value given from an external.

If the threshold variation amount for one of the NT 31 and the NT 32 is not obtained, a threshold value correction value is detected by calibration or the like performed before the circuit operation and is then stored in the circuit.

Figure 9:
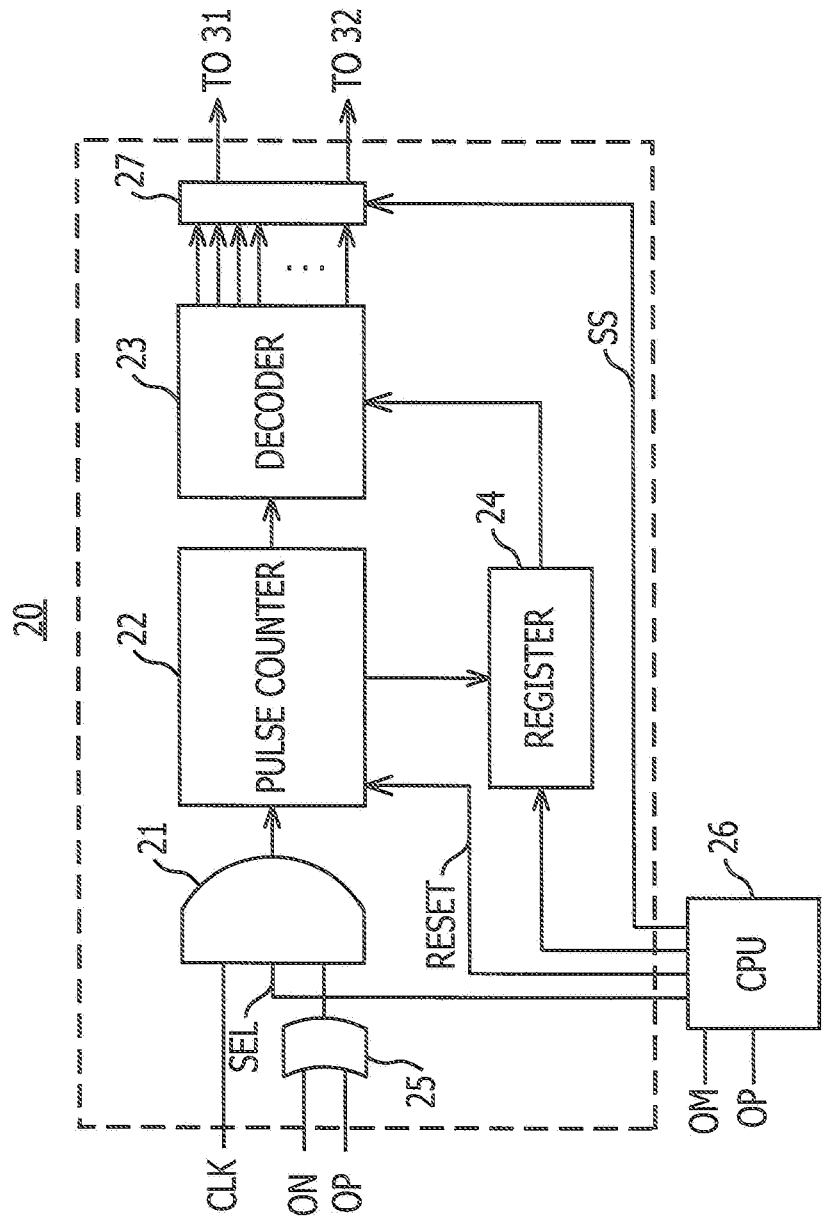
FIG. 9 illustrates an exemplary control circuit.

FIG. 9 illustrates an exemplary control circuit. The control circuit 20 illustrated in FIG. 9 performs the calibration. The control circuit 20 includes an AND gate 21, a pulse counter 22, a decoder 23, a register 24, an OR gate 25, and a signal supply circuit 27. A CPU 26, which may be included in an LSI in which the comparator or the A/D converter having the comparator is provided, outputs the control signal to the control circuit 20. If the CPU 26 is not included, a simple sequence circuit or the like may generate the control signal.

The OR gate 25 outputs a high level when either the output signal OP or the output signal ON of the comparator is at a high level. The AND gate 21 supplies the CLK to the pulse counter 22 when both the correction signal set, which is output from the CPU 26 and is H (high level) at a time of the calibration of the control circuit 20, and the output of the comparator are at a high level.

The pulse counter 22 counts the CLK while the CLK is supplied from the AND gate 21. When the supply of the CLK from the AND gate 21 is stopped, the pulse counter 22 outputs a count value at that moment as a correction value cal to the register 24.

The decoder 23 outputs a code signal according to the correction value cal from the register 24. The register 24 stores the correction value cal that is output from the pulse counter 22.

When the comparator normally operates, the control circuit 20 performs the control in such a way that the data, which is stored in the register 24 based on a writing order from the CPU 25, is output to the decoder 23. The decoder 23 decodes the data from the register 24 and then outputs a code signal to the correction circuits 31 and 32. When the comparator performs the calibration operation, the control circuit 20 may perform the operation illustrated in FIG. 10.

Figure 10:
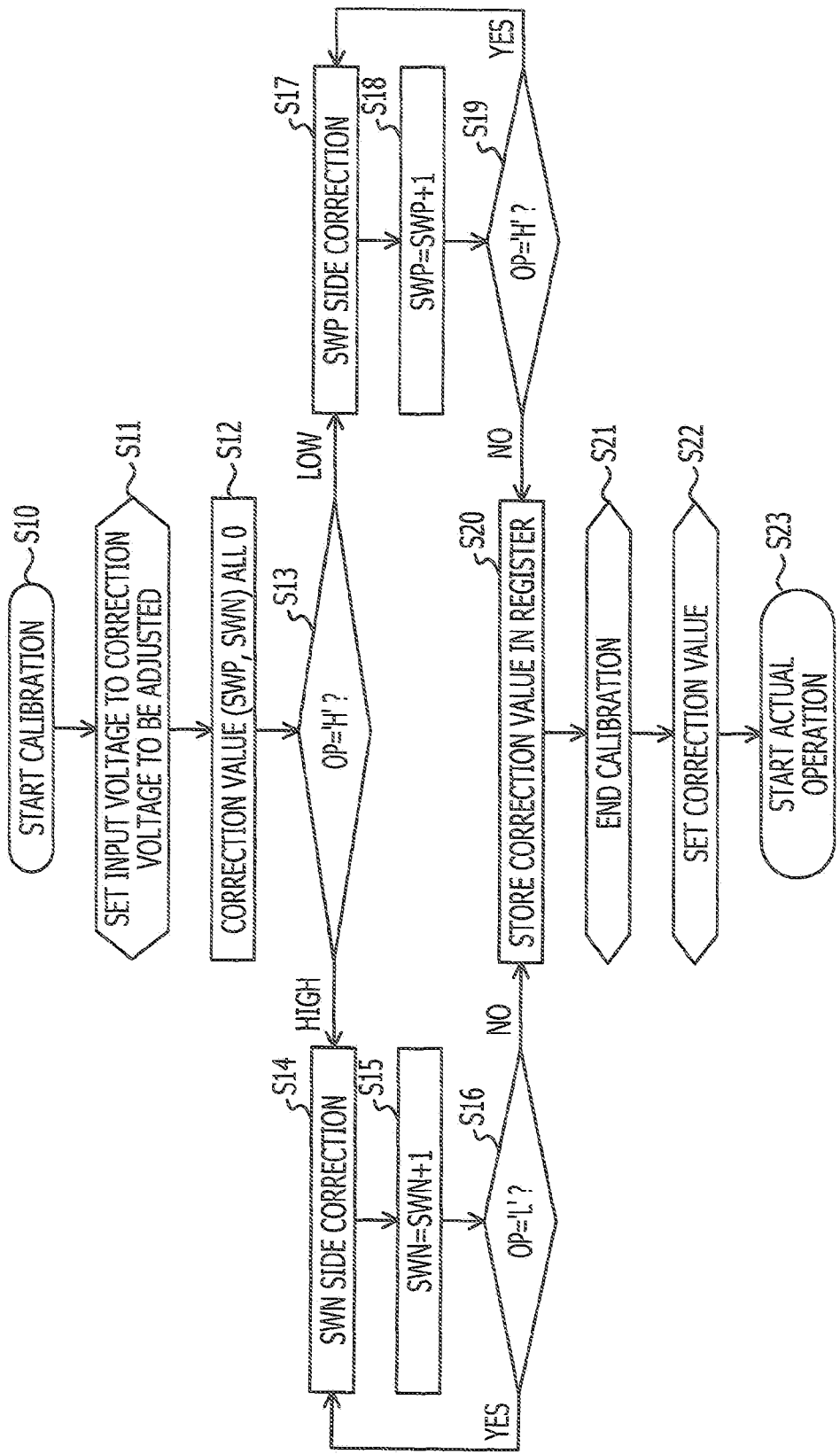
FIG. 10 illustrates an exemplary calibration operation of a comparator.

FIG. 10 illustrates an exemplary calibration operation. In an operation S10, the calibration is started. The VIN may be set to a prescribed value, for example, 1.0V.

In an operation S11, the voltage of the input signal VIP to be input into the comparator is set to a correction voltage that is desired to be adjusted. For example, when the comparator is set in such a way that the OP changes into H (1) if the VIP is smaller than 1.10V and that the OP changes into L (0) if the VIP is equal to or larger than 1.10V, the VIP is set to 1.10V if the threshold value is set to VIN+0.10V, for example.

In an operation S12, the SWN [n] and the SWP [n] output from the control circuit 20 are set to 0 (L).

In an operation S13, determination of OP=H (high level) is performed. If High, the process goes to an operation 514. If Low, the process goes to an operation S17.

In an operation S14, SWN side correction is performed to correct the number of the switches SW 31 to be coupled (turned on) in the correction circuit 31.

In an operation S15, the number of the switches SW 31 in the correction circuit 31 is increased by one (SWN=SWN+1).

In an operation S16, it is determined whether the OP changes into L (low level). If there is no change, the process goes back to the operation S14. If the OP changes into L (low level), the process goes to an operation S20.

When the operation S14 to the operation S16 are repeated, the comparator is set in such a way that the OP changes into H (high level) if the VIP is equal to or smaller than 1.10V and that the OP changes into L (low level) if the VIP is equal to or larger than 1.10V. For example, the threshold value may be set to VIN+0.01V=1.10V.

In an operation S17, SWP side correction is performed to correct the number of the switches SW 32 to be coupled (turned on) in the correction circuit 32.

In an operation S18, the number of the switches SW 32 in the correction circuit 32 is increased by one (SWP=SWP+1).

In an operation S19, it is determined whether the OP changes into H (high level). If there is no change, the process goes back to the operation S17. If the OP changes into H (high level), the process goes to an operation S20.

When the operation S17 to the operation 19 are repeated, the comparator is set in such a way that the OP changes into H (high level) if the VIP is smaller than 1.10V and that the OP changes into L (low level) if the VIP is equal to or larger than 1.10V. For example, the threshold value may be set to VIN+0.10V=1.10V.

In the operation S20, the correction values SWN and SWP are stored in a register (memory). If all the switches SW 31 in the correction circuit 31 are turned off (released), SWN=0 may be set. If all the switches SW 32 in the correction circuit 32 are turned off (released), SWP=0 may be set.

In an operation S21, the calibration ends. In an operation S22, the correction value stored in the operation S20 is set to the correction circuits 31 and 32. In an operation S23, the regular comparing processing is started.

As for the threshold value correction, the VIN may be set to 1.0V. If the range of the threshold value that is correctable by the correction circuit 31 is 0.20V and if the range of the threshold value that is correctable by the correction circuit 32 is 0.20V, the threshold value may be set within the range from 0.80V to 1.20V.

Figure 11:
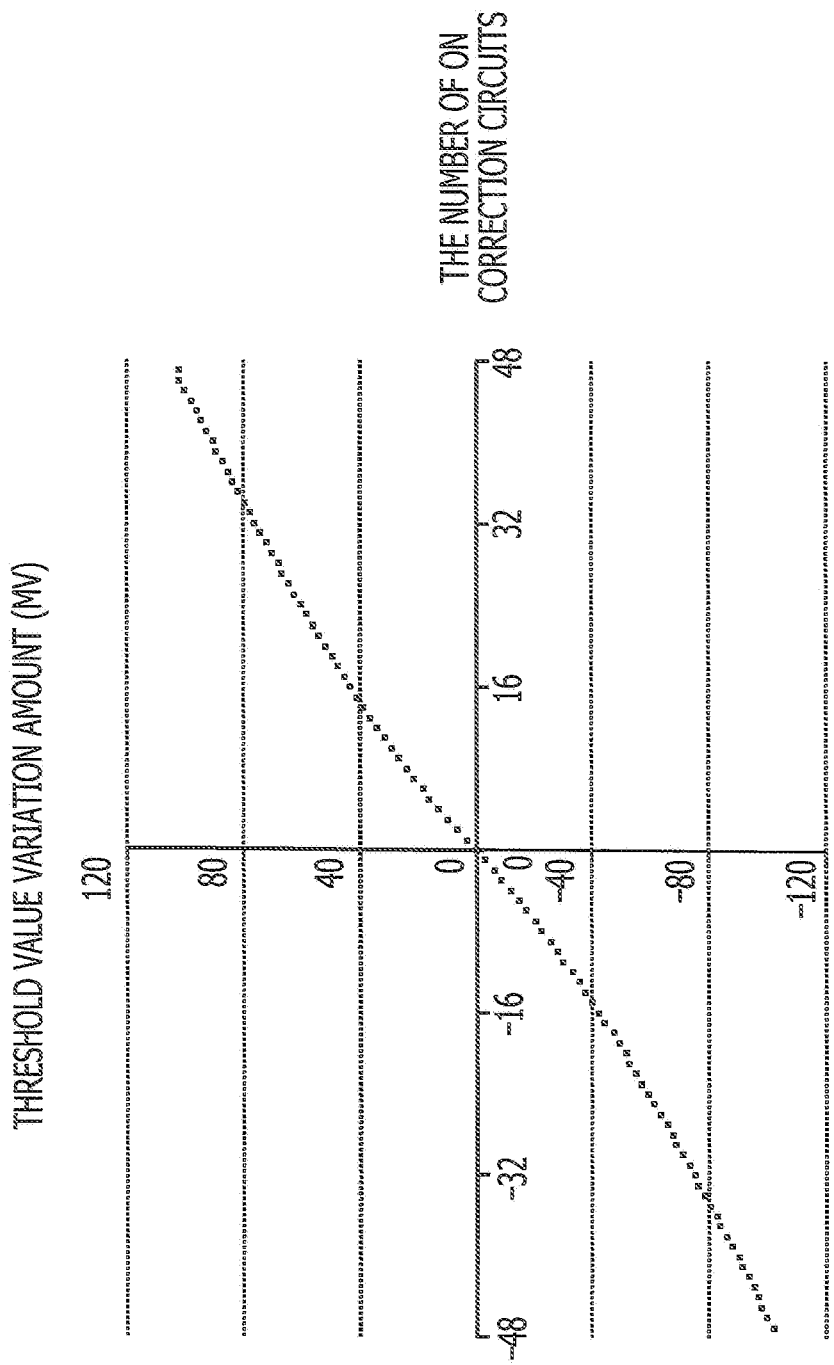
FIG. 11 illustrates an exemplary offset correction amount.

FIG. 11 illustrates an exemplary offset correction amount. FIG. 11 may illustrate the offset correction amount by the calibration operation illustrated in FIG. 10. In each of the correction circuits 31 and 32, 47 switches SW 31 and 47 switches SW 32 in substantially the same size are provided. In FIG. 11, the horizontal axis indicates the number of correction circuits to be turned on. Here, + indicates the correction circuit 32, for example, a switch SW 21 on the SWP side is turned on. Here, − indicates the correction circuit 31, for example, the switch SW 31 on the SWN side is turned on. In FIG. 11, the vertical axis indicates the variation amount of the threshold value, for example, the value of VIP−VIN obtained when the offset correction is completed. For example, if 15 switches SW 21 are turned on in the correction circuit 32, the threshold value is 40 mV. The output of VIP−VIN is reversed at the threshold value. The control is performed in such a way that the threshold value arbitrarily varies within a prescribed range.

The threshold variation value may be increased or decreased by changing the size of the NT 31 and the NT 32 in the correction circuits 31 and 32. The transistor size of the NT 31 and the NT 32 may be substantially the same and may not be substantially the same. The transistor size is arbitrary.

In the above-described comparator, the offset correction is performed without an external bias circuit. A threshold value of comparison varies within a prescribed range.

Since the above-described comparator corrects the threshold value without attaching the capacity to a signal path, the speed may not be reduced by the load based on the capacity attachment.

Regarding the correction by the above-described comparator, the steady current may not flow, and the current may flow at a time of the determination. Thus, the power consumption may be reduced.

Figure 12:
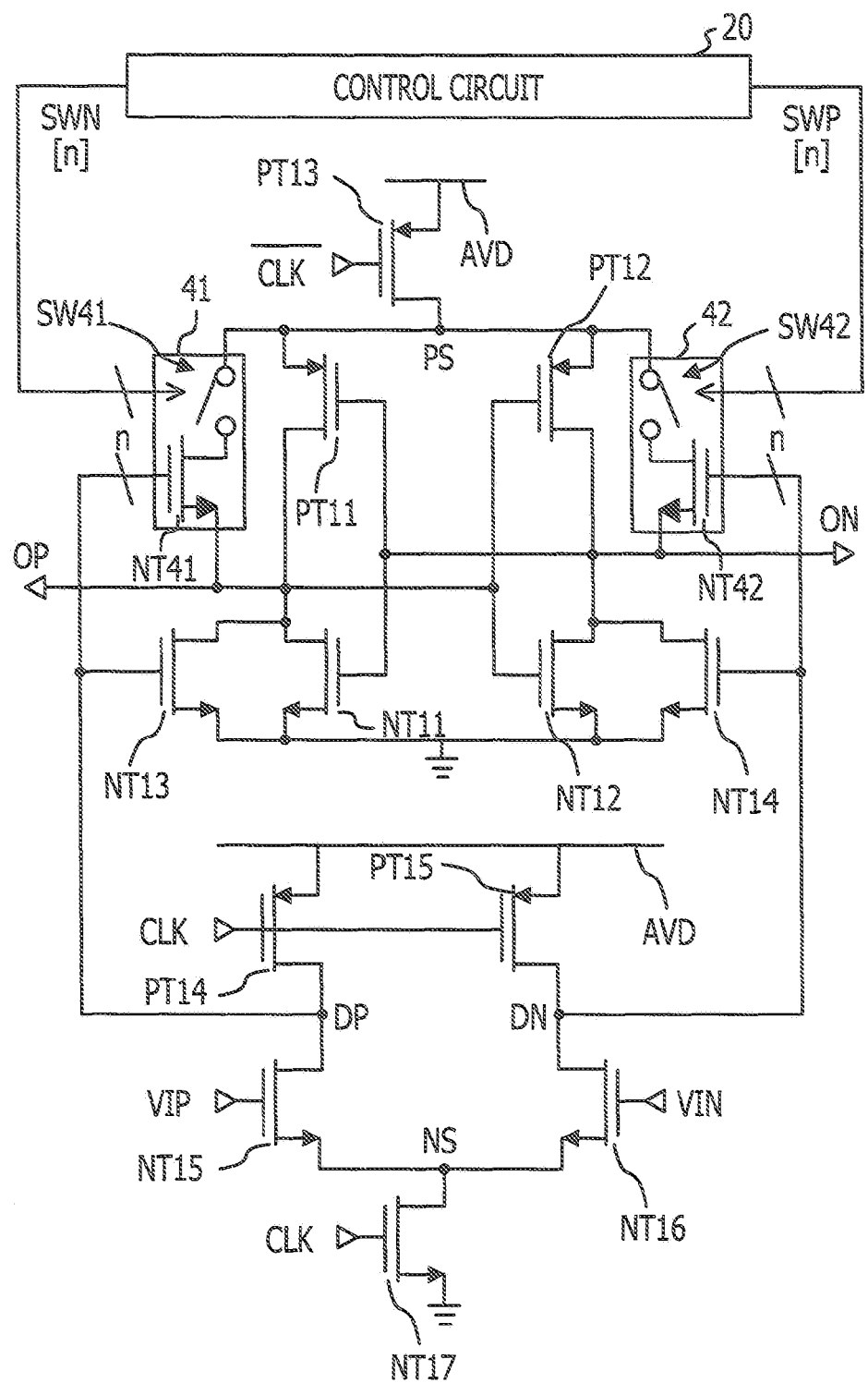
FIG. 12 illustrates an exemplary comparator.

FIG. 12 illustrates an exemplary comparator. As for the comparator illustrated in FIG. 12, the coupling order of the NMOS transistor NT 41 and of the NMOS transistor NT 42 and a switch SW 42 in correction circuits 41 and 42 may differ from the coupling order of the comparator illustrated in FIG. 7. In FIG. 12, the other elements may be substantially the same or similar to as the elements illustrated in FIG. 7. The comparator illustrated in FIG. 12 may perform operation that is substantially the same as or similar to the operation of the comparator illustrated in FIG. 7.

Figure 13:
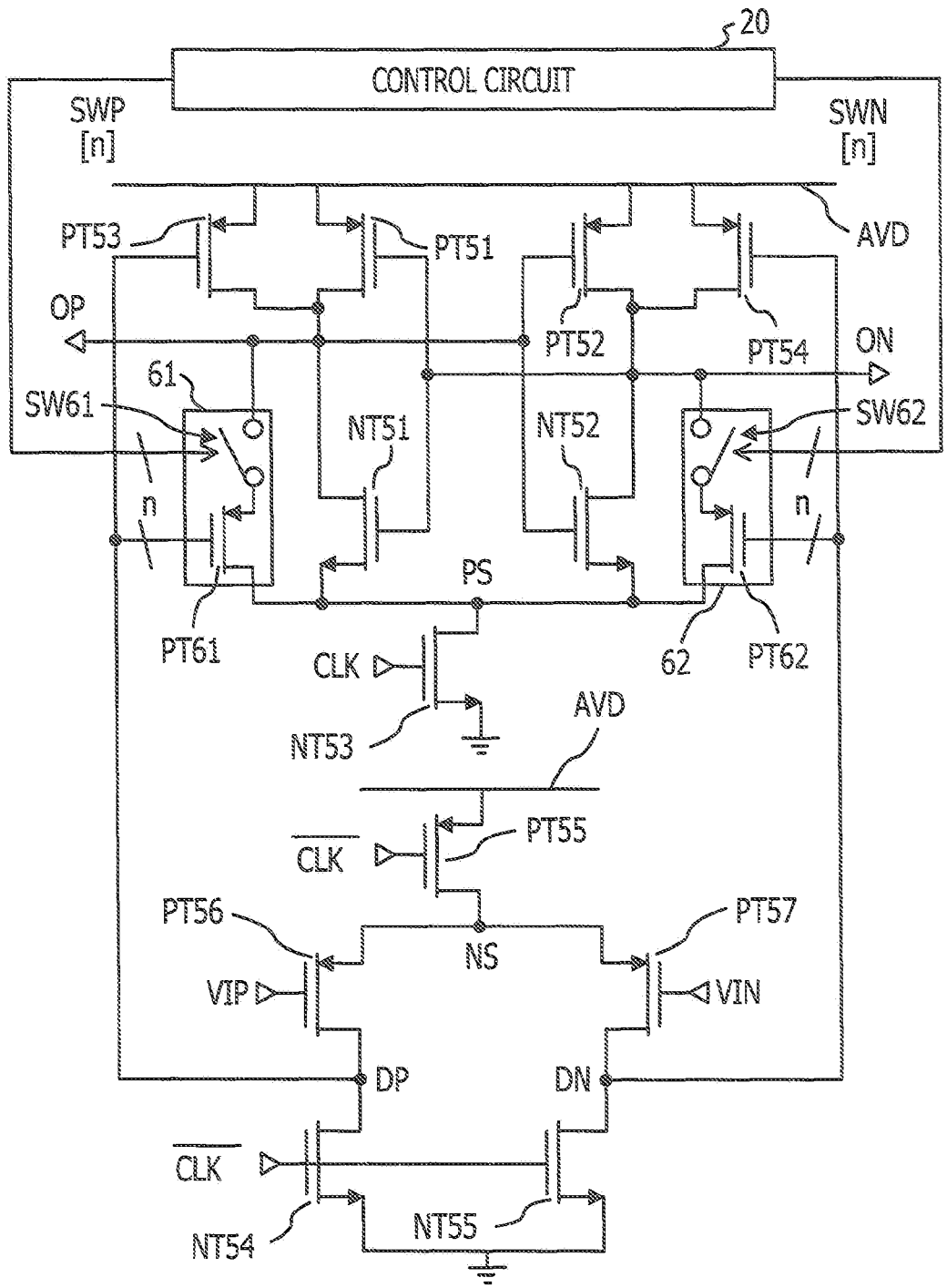
FIG. 13 illustrates an exemplary comparator.

FIG. 13 illustrates an exemplary example of the comparator. As for the comparator illustrated in FIG. 13, compared to the comparator illustrated in FIG. 7, the polar character of the transistor of a tail part of the circuit is changed. In FIG. 13, the other elements may be substantially the same as or similar to the elements illustrated in FIG. 7. As for the comparator illustrated in FIG. 7, the input signals VIP and VIN are input into the gate of the NMOS transistors NT 15 and NT 16. As for the comparator illustrated in FIG. 13, the input signals VIP and VIN are input into the gate of the PMOS transistors PT 56 and PT 57, and the circuit in the latter stage is changed. For example, the transistor of correction circuits 61 and 62 is changed into the PMOS. The polar character of the comparator illustrated in FIG. 13 is reversed to the polar character of the comparator illustrated in FIG. 7. Regardless of reversion of the polar character, the comparator illustrated in FIG. 13 may operate in substantially the same way as the comparator illustrated in FIG. 7.

Figure 14:
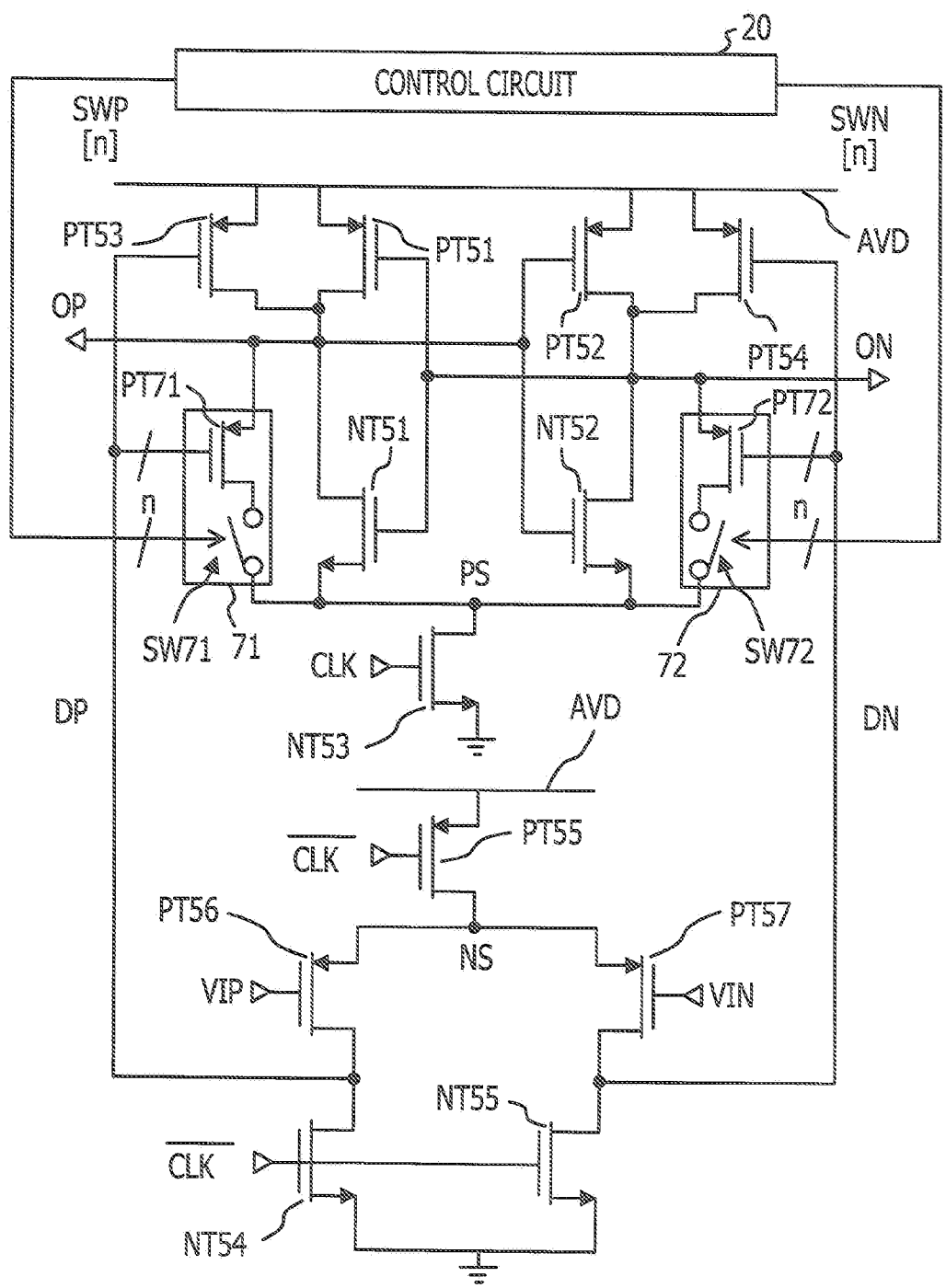
FIG. 14 illustrates an exemplary the comparator.

FIG. 14 illustrates an exemplary comparator. As for the comparator illustrated in FIG. 14, the coupling order of a PMOS transistor PT 71 and a switch SW 71 and of a PMOS transistor PT 72 and a switch 72 in correction circuits 71 and 72 may differ from the coupling order of the comparator illustrated in FIG. 13, In FIG. 14, the other elements may be substantially the same as or similar to the elements illustrated in FIG. 13. The comparator illustrated in FIG. 14 may perform operation that is substantially the same as or similar to the operation of the comparator illustrated in FIG. 13.

The above-described comparator adjusts the offset and sets the threshold value.

FIG. 15 illustrates an exemplary A/D converter. The A/D converter illustrated in FIG. 15 may have a 4-bit configuration. The A/D converter illustrated in FIG. 15 includes a ladder resistance 80, eight comparators 81a to 81h, seven NAND gates 82a to 82g, and an encoder 83. The ladder resistance 80 includes resistances R0 to R8 coupled in series between the high potential power source AVD and the low potential power source GND, and reference potentials V1 to V8 are output from the coupling node of the resistance. The comparators 81a to 81h may be a comparator illustrated in FIG. 7, FIG. 12, FIG, 13, or FIG. 14. The analog signal Vin to be digitalized is input as the input signal VIP, and the reference potentials V1 to V8 are input as the input signal VIN. The NAND gates 82a to 82g output [1] if the output values of the two adjacent comparators are the same each other and output [0] if the output values of the two adjacent comparators are different from each other. The encoder 83 outputs encode data indicating the position of [0] from among the outputs of the seven NAND gates 82a to 82g.

The resistance value of the resistances R0 to R8 of the ladder resistance 80 may be precisely set by trimming or the like. The reference potentials V1 to V8 may have voltage values with equal intervals. The eight comparators 81a to 81h are adjusted in such a way that an analog signal Vin varies at the time of the reference potentials V1 to V8, for example, in such a way that the offset becomes zero. An entire control circuit (not illustrated) may be provided to control the calibration processing for sequentially adjusting the offset of the eight comparators 81a to 81h. For example, the CPU 26 illustrated in FIG. 9 may control the calibration processing.

As for the above-described comparator, the threshold value is arbitrarily adjusted. Therefore, even if the resistance value of the resistances R0 to R8 is not precisely set and even if the reference potentials do not have voltage values with equal intervals, accurate A/D conversion data may be obtained. The calibration processing is performed in such a way that accurate reference potentials as the analog signal Vin are sequentially input and the threshold value of the corresponding comparator is each of the reference potentials. As a result, the resistance value of the resistances R0 to R8 may not be accurately set by trimming or the like. The entire control circuit may be provided.

Figure 16:
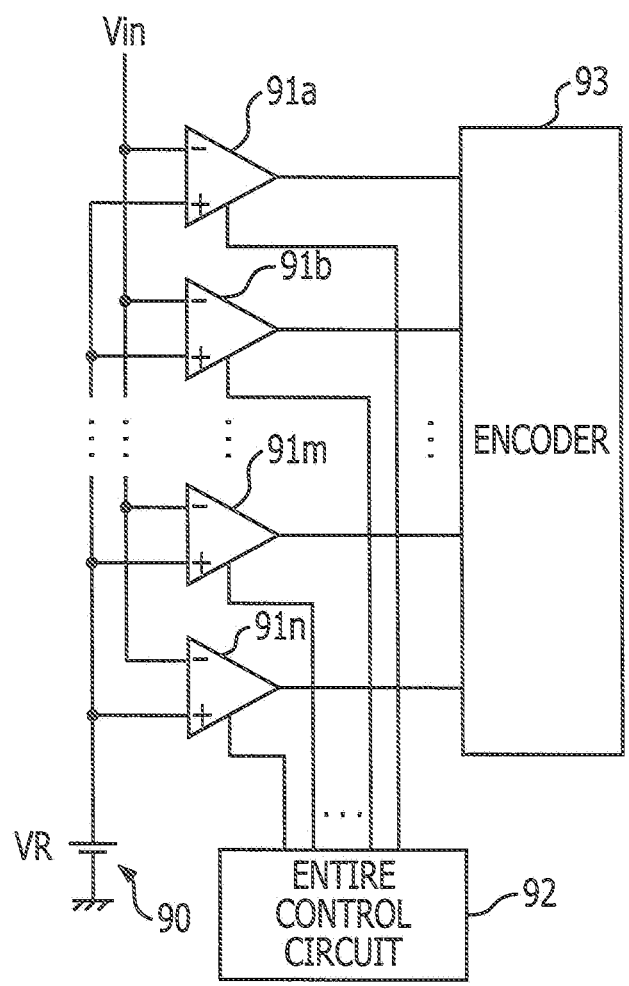
FIG. 16 illustrates an exemplary A/D converter.

FIG. 16 illustrates an exemplary A/D converter. An analog signal with a relatively narrow input range may be input into the A/D converter illustrated in FIG. 16.

The ND converter illustrated in FIG. 16 includes a reference voltage source 90, several comparators 91a to 91n, an entire control circuit 92, and an encoder 93. The reference voltage source 90 outputs a single reference voltage VR. The comparators 91a to 91n may be the comparator illustrated in FIG. 7, FIG. 12, FIG. 13, or FIG. 14. The analog signal Vin to be digitalized is input as the input signal VIP, and the reference potential VR is input as the input signal VIN. The entire control circuit 92 performs the control in such a way that the calibration operation is sequentially performed in the comparators 91a to 91n. The encoder 93 generates data indicating the voltage value of the analog signal Vin based on an output of the comparators 91a to 91n. The encoder 93 detects the position in which the output of the comparators 91a to 91n varies or detects, by a known method such as the principle of majority rule, the position in which the output of the comparators 91a to 91n varies.

The above-described comparator arbitrarily adjusts the threshold value. The comparators 91a to 91n in the A/D converter illustrated in FIG. 16 are set to have threshold values that are shifted by a prescribed width with respect to the reference voltage VR. For example, seven comparators are provided, the prescribed width is set to 30 mV, and the threshold values are sequentially set to VR−90 mV, VR−60 mV, VR−30 mV, VR, VR+30 mV, VR+60 mV, and VR+90 mV. A 3-bit A/D with the input range as VR±90 mV is realized. The number of bits is increased due to an increase of the number of comparators, and the threshold value adjustment range of each of the comparators is widened.

Thus, the input range is expanded.

Since the ladder resistance is not used, the A/D converter illustrated in FIG. 16 may be minimized. Since the ladder resistance in which the steady current flows is not used, the power consumption is reduced.

Figure 17:
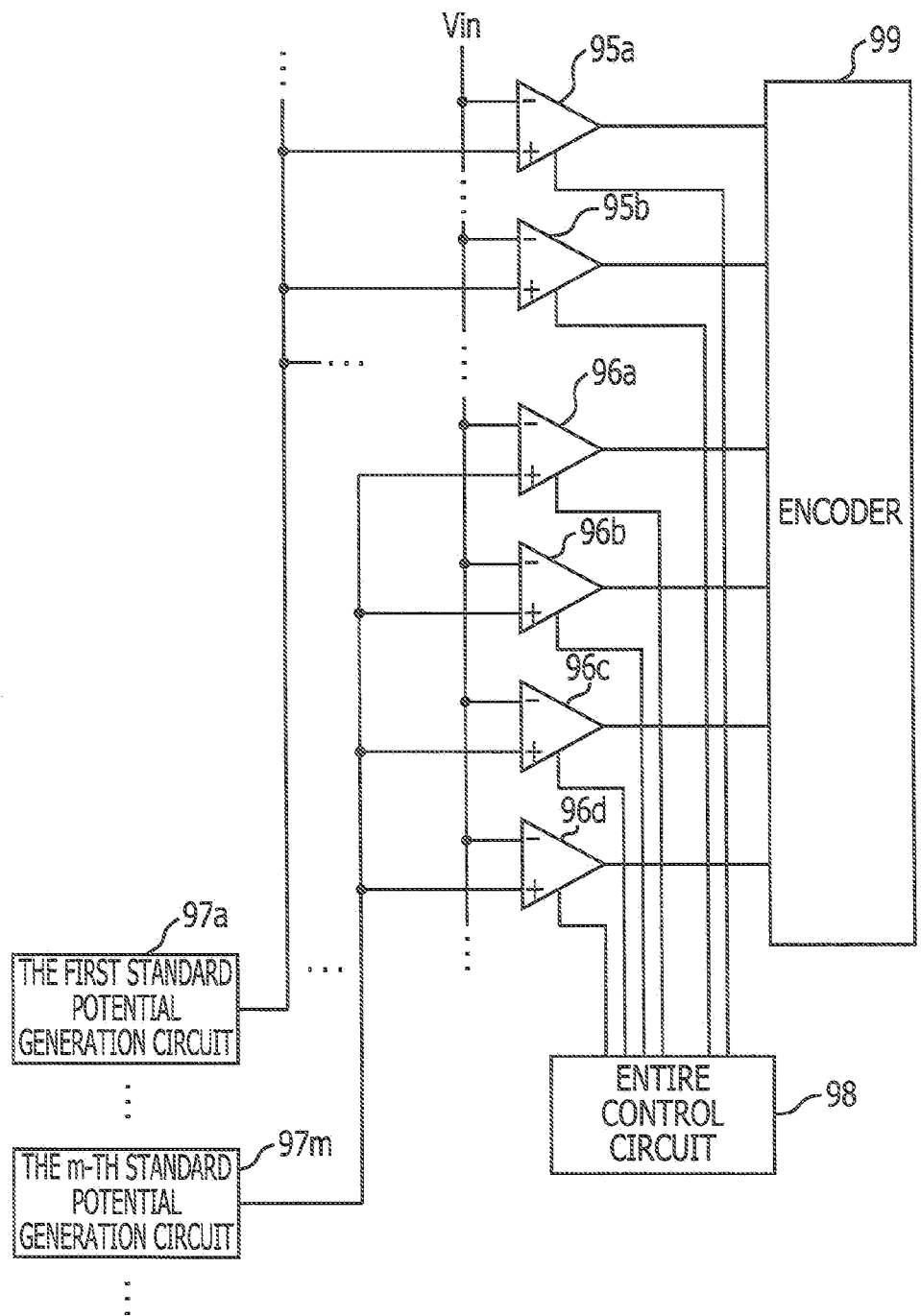
FIG. 17 illustrates an exemplary A/D converter.

FIG. 17 illustrates an exemplary A/D converter. The A/D converter illustrated in FIG. 17 may be combined with the A/D converter illustrated in FIGS. 15 and 16.

The A/D converter illustrated in FIG. 17 includes several standard potential generation circuits 97a to 97m, several comparators 95a to 95b and 86a to 96d, an entire control circuit 98, and an encoder 99. The entire control circuit 98 and the encoder 99 may be substantially the same as the entire control circuit and the encoder illustrated in FIG. 16. Based on the number of bits of the A/D converter, the standard potential generation circuits 97a to 97m generate fewer reference potentials than the reference potentials to be used. For example, 63 reference potentials are used in case of a 6-bit A/D converter, and eight reference potentials are generated. The reference potential may be generated by the ladder resistance illustrated in FIG. 15 and may also be generated by the D/A converter or the like.

The comparators are divided into several groups. The groups are supplied with the similar reference potentials as the input signal VIN. For example, when the 6-bit A/D converter generates eight reference potentials, 63 comparators may be divided into eight groups. In this case, one of the eight groups may have seven comparators. In each of the groups, eight comparators are set to have eight different equal intervals corresponding to a single supplied reference potential. The minimum threshold value and the maximum threshold value of the adjacent groups are set to have equal intervals. As a result, 63 comparators in which the threshold varies in the equal intervals may be obtained.

Even if the adjustment range of the threshold values of the comparators of the A/D converter illustrated in FIG. 17 is relatively narrow, the analog signal with a relatively wide input range is A/D converted.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A comparator, comprising:
a differential amplifier circuit configured to operate based on a clock signal and output a first intermediate output and a second intermediate output corresponding to a first input signal and a second input signal respectively; and
a differential latch circuit configured to operate based on the first intermediate output and the second intermediate output, the differential latch circuit comprising:
a first line comprising a first PMOS transistor and a first NMOS transistor coupled in series;
a second line, coupled to the first line, comprising a second PMOS transistor and a second NMOS transistor coupled in series, wherein a gate of the first PMOS transistor and the first NMOS transistor is coupled to a coupling node of the second PMOS transistor and the second NMOS transistor and the gate of the second PMOS transistor and the second NMOS transistor is coupled to the coupling node of the first PMOS transistor and the first NMOS transistor; and
a third PMOS transistor provided between a source of the first PMOS transistor and the second PMOS transistor and a high potential power supply, a gate of a third PMOS transistor receiving a reverse signal of the clock signal.

2. The comparator according to claim 1, further comprising a control circuit to control a sensitivity of the differential latch circuit.

3. The comparator according to claim 1, wherein the coupling node of the first PMOS transistor and the first NMOS transistor and the coupling node of the second PMOS transistor and the second NMOS transistor output a comparison result.

4. A comparator, comprising:
a differential amplifier circuit configured to operate based on a clock signal and output a first intermediate output and a second intermediate output corresponding to a first input signal and a second input signal respectively; and
a differential latch circuit configured to operate based on the first intermediate output and the second intermediate output, the differential latch circuit comprising:
a first line comprising a first PMOS transistor and a first NMOS transistor coupled in series;
a second line, coupled to the first line, comprising a second PMOS transistor and a second NMOS transistor coupled in series, wherein a gate of the first PMOS transistor and the first NMOS transistor is coupled to a coupling node of the second PMOS transistor and the second NMOS transistor and the gate of the second PMOS transistor and the second NMOS transistor is coupled to the coupling node of the first PMOS transistor and the first NMOS transistor;
a first intermediate input NMOS transistor coupled to the first NMOS transistor in parallel;
a second intermediate input NMOS transistor coupled to the second NMOS transistor in parallel;
a plurality of first adjustment NMOS transistors coupled to the first PMOS transistor in parallel, a number of first adjustment NMOS transistors to be coupled being controllable; and

13 a plurality of second adjustment NMOS transistors coupled to the second PMOS transistor in parallel, a number of second adjustment NMOS transistors to be coupled being controllable.

5. The comparator according to claim 4, wherein the first intermediate output is coupled to the gate of the first intermediate input NMOS transistor and the plurality of first adjustment NMOS transistors, and wherein the second intermediate output is coupled to the gate of the second intermediate input NMOS transistor and the plurality of second adjustment NMOS transistors.

6. The comparator according to claim 4, wherein each of the plurality of first adjustment NMOS transistors is coupled to a switch, which is controlled by the control circuit, in series and a line of the first adjustment NMOS transistor and the switch coupled in series is coupled to the first PMOS transistor in parallel, and wherein each of the plurality of second adjustment NMOS transistors is coupled to the switch, which is controlled by the control circuit, in series, and a line of the second adjustment NMOS transistor and the switch coupled in series is coupled to the second PMOS transistor in parallel.

7. A comparator, comprising:
a differential amplifier circuit configured to operate based on a clock signal and output a first intermediate output and a second intermediate output corresponding to a first input signal and a second input signal respectively;
a differential latch circuit configured to operate based on the first intermediate output and the second intermediate output, the differential latch circuit comprising:
a first line comprising a first PMOS transistor and a first NMOS transistor coupled in series;
a second line, coupled to the first line, comprising a second PMOS transistor and a second NMOS transistor coupled in series, wherein a gate of the first PMOS transistor and the first NMOS transistor is coupled to a coupling node of the second PMOS transistor and the second NMOS transistor and the gate of the second PMOS transistor and the second NMOS transistor is coupled to the coupling node of the first PMOS transistor and the first NMOS transistor; and
a third NMOS transistor coupled between the source of the first NMOS transistor and the second NMOS transistor and a low potential power supply, a gate of the third NMOS transistor receiving the clock signal.

8. A comparator, comprising:
a differential amplifier circuit configured to operate based on a clock signal and output a first intermediate output and a second intermediate output corresponding to a first input signal and a second input signal respectively; and
a differential latch circuit configured to operate based on the first intermediate output and the second intermediate output, the differential latch circuit comprising:
a first line comprising a first PMOS transistor and a first NMOS transistor coupled in series;
a second line, coupled to the first line, comprising a second PMOS transistor and a second NMOS transistor coupled in series, wherein a gate of the first PMOS transistor and the first NMOS transistor is coupled to a coupling node of the second PMOS transistor and the second NMOS transistor and the gate of the second PMOS transistor and the second NMOS transistor is coupled to the coupling node of the first PMOS transistor and the first NMOS transistor; and
a first intermediate input PMOS transistor coupled to the first PMOS transistor in parallel;

14 a second intermediate input PMOS transistor coupled to the second PMOS transistor in parallel;
a plurality of first adjustment PMOS transistors coupled to the first NMOS transistor in parallel, a number of first adjustment PMOS transistors to be coupled being controllable; and
a plurality of second adjustment PMOS transistors coupled to the second NMOS transistor in parallel, a number of second adjustment PMOS transistors to be coupled being controllable.

9. The comparator according to claim 8, wherein the first intermediate output is coupled to the gate of the first intermediate input PMOS transistor and the plurality of first adjustment PMOS transistors, and wherein the second intermediate output is coupled to the gate of the second intermediate input PMOS transistor and the plurality of second adjustment PMOS transistors.

10. The comparator according to claim 8, wherein each of the plurality of first adjustment PMOS transistors is coupled to the switch, which is controlled by the control circuit, in series and a line of the first adjustment PMOS transistor and the switch coupled in series is coupled to the second NMOS transistor in parallel, and wherein each of the plurality of second adjustment PMOS transistors is coupled to the switch, which is controlled by the control circuit, in series and a line of the second adjustment PMOS transistor and the switch coupled in series, is coupled to the second NMOS transistor in parallel.

11. An analog-to-digital converter, comprising:
a plurality of comparators; and
a processing circuit to generate a block of digital data corresponding to a voltage of an analog input signal based on a comparison result of the plurality of comparators with respect to the analog input signal,
wherein each of the plurality of comparators comprises:
a differential amplifier circuit configured to operate based on a clock signal and output a first intermediate output and a second intermediate output corresponding to a first input signal and a second input signal respectively; and
a differential latch circuit configured to operate based on the first intermediate output and the second intermediate output, the differential latch circuit comprising:
a first line comprising a first PMOS transistor and a first NMOS transistor coupled in series:
a second line, coupled to the first line, comprising a second PMOS transistor and a second NMOS transistor coupled in series, wherein a gate of the first PMOS transistor and the first NMOS transistor is coupled to a coupling node of the second PMOS transistor and the second NMOS transistor and the gate of the second PMOS transistor and the second NMOS transistor is coupled to the coupling node of the first PMOS transistor and the first NMOS transistor; and
a third PMOS transistor provided between a source of the first PMOS transistor and the second PMOS transistor and a high potential power supply, a gate of a third PMOS transistor receiving a reverse signal of the clock signal.

12. The analog-to-digital converter according to claim 11, wherein each of the plurality of comparators further comprises a control circuit to control a sensitivity of the differential latch circuit.

* * * * *